(12) United States Patent
Sharma et al.

(10) Patent No.: US 11,348,973 B2
(45) Date of Patent: May 31, 2022

(54) THRESHOLD SWITCHING SELECTOR BASED MEMORY

(71) Applicant: Intel Corporation, Santa Clara, CA (US)

(72) Inventors: Abhishek A. Sharma, Hillsboro, OR (US); Van H. Le, Portland, OR (US); Gilbert Dewey, Beaverton, OR (US); Rafael Rios, Austin, TX (US); Jack T. Kavalieros, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 564 days.

(21) Appl. No.: 16/326,896

(22) PCT Filed: Sep. 23, 2016

(86) PCT No.: PCT/US2016/053585
§ 371 (c)(1),
(2) Date: Feb. 20, 2019

(87) PCT Pub. No.: WO2018/057012
PCT Pub. Date: Mar. 29, 2018

(65) Prior Publication Data
US 2021/0288108 A1  Sep. 16, 2021

(51) Int. Cl.
*H01L 27/24* (2006.01)
*H01L 45/00* (2006.01)

(52) U.S. Cl.
CPC ...... *H01L 27/2427* (2013.01); *H01L 45/1253* (2013.01); *H01L 45/144* (2013.01); *H01L 45/146* (2013.01); *H01L 45/148* (2013.01)

(58) Field of Classification Search
CPC ............... H01L 27/2427; H01L 45/146; H01L 45/1266; H01L 45/1253; H01L 45/1233; H01L 45/08
See application file for complete search history.

(56) References Cited

U.S. PATENT DOCUMENTS 9,543,512 B2 * 1/2017 Ohba ................... H01L 45/144
2012/0043519 A1 2/2012 Jo et al.
(Continued)

OTHER PUBLICATIONS

International Search Report and Written Opinion dated Apr. 25, 2017 for International Application No. PCT/US2016/053585, 14 pages.

*Primary Examiner* — Allison Bernstein
(74) *Attorney, Agent, or Firm* — Schwabe, Williamson & Wyatt, P.C.

(57) ABSTRACT

Embodiments include a threshold switching selector. The threshold switching selector may include a threshold switching layer and a semiconductor layer between two electrodes. A memory cell may include the threshold switching selector coupled to a storage cell. The storage cell may be a PCRAM storage cell, a MRAM storage cell, or a RRAM storage cell. In addition, a RRAM device may include a RRAM storage cell, coupled to a threshold switching selector, where the threshold switching selector may include a threshold switching layer and a semiconductor layer, and the semiconductor layer of the threshold switching selector may be shared with the semiconductor layer of the RRAM storage cell.

21 Claims, 6 Drawing Sheets

(56) References Cited

U.S. PATENT DOCUMENTS

| | | |
|---|---|---|
| 2013/0021835 A1 | 1/2013 | Hwang et al. |
| 2013/0270509 A1 | 10/2013 | Hwang et al. |
| 2013/0279240 A1 | 10/2013 | Jo |
| 2014/0175360 A1 | 6/2014 | Tendulkar et al. |
| 2015/0207066 A1* | 7/2015 | Ohba .................. H01L 27/2463 257/4 |
| 2016/0163979 A1* | 6/2016 | Lee ........................ H01L 45/08 257/4 |

* cited by examiner

THRESHOLD SWITCHING SELECTOR BASED MEMORY

CROSS REFERENCE TO RELATED APPLICATIONS

The present application is a national phase entry under 35 U.S.C. § 371 of International Application No. PCT/US2016/053585, filed Sep. 23, 2016, entitled "THRESHOLD SWITCHING SELECTOR BASED MEMORY", which designated, among the various States, the United States of America. The Specifications of the PCT/US2016/053585 Application is hereby incorporated by reference.

FIELD

Embodiments of the present disclosure relate generally to the technical field of electronic circuits, and more particularly to memory.

BACKGROUND

The memory system is an important component of modern computers and communication devices. Volatile, high speed memory like static random access memory (static RAM or SRAM) or dynamic random-access memory (DRAM) may be used for cache and main memory, while magnetic disks may be used for high-end data storage. In addition, persistent and low speed flash memory may be used for storage with low capacity and/or low energy consumption in embedded or mobile devices. The emergence of nonvolatile memory (NVM), such as phase change random access memory (PCRAM), resistive random access memory (RRAM), or magnetic random access memory (MRAM) may provide many alternatives for different applications using computing and communication devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Nonvolatile memory (NVM) may include phase change random access memory (PCRAM), resistive random access memory (RRAM), magnetic random access memory (MRAM), or others. NVM may store data based on the resistance value of a storage cell, instead of the voltage. For example, PCRAM may rely on one or more materials, called phase-change materials, which exist in two different phases: an amorphous phase, having a high resistance value, and a crystalline phase, having a low resistance value. RRAM may store data as certain resistance values, and change resistance values by the motion of oxygen ions, rather than electrons. In addition, MRAM may include a magnetic tunnel junction (MTJ) including two ferromagnetic layers, called a reference layer and a free layer. The reference layer may keep its magnetic direction fixed, while the free layer may have its magnetic direction changed by means of either an applied magnetic field or a polarized current. When both the reference layer and the free layer have the same magnetic direction, the resistance value of the MTJ may be low. If they have different magnetic directions, the resistance value of the MTJ may be high.

In NVM and other kinds of memory, a memory array may include multiple memory cells. A memory cell may include a storage cell coupled to a selector. There may be many kinds of selectors, e.g., a transistor, a diode, a volatile switching such as a threshold switching selector, a nonlinear device, or more. The selector may be switchable between an "on" state and an "off" state to provide access to the associated memory cell (e.g., for read, write, and/or other memory operations).

A threshold switching selector may switch between an "on" state and an "off" state depending on the amount of current or voltage applied across the threshold switching selector. The state of the threshold switching selector may change when a current or voltage through the threshold switching selector exceeds a respective threshold current or voltage. Once the threshold current or voltage is reached, the on state is triggered and the threshold switching selector may be in a substantially conductive state. If the current or voltage drops below a threshold value, the threshold switching selector may return to the off state. In existing implementations, the threshold current or voltage at which a threshold switching selector switches to the on state may be relatively high. The high threshold current or voltage may lead to high leaked power consumption of the memory array. In addition, the high threshold current or voltage may lead to permanent failure, and reduced endurance lifetime of the storage cell coupled to the threshold switching selector.

In embodiments, a threshold switching selector may include a threshold switching layer and a semiconductor layer between two electrodes. In embodiments, an electrode may be referred to as a terminal, or a contact. When two electrodes are not adjacent to the threshold switching layer or the semiconductor layer, the threshold switching layer and the semiconductor layer may simply be referred to as a threshold switching selector. The use of a semiconductor layer in a threshold switching selector may reduce the threshold current or voltage of the threshold switching selector. For example, in some embodiments, the threshold current of a threshold switching selector with a semiconductor layer may be as low as 1e-10 amps (A), while normally the threshold current may be around 1e-8 A for a threshold switching selector without a semiconductor layer. The low threshold current in embodiments may lead to low leakage during disturb conditions for the threshold switching selector and the storage cell coupled to the threshold switching selector.

In embodiments, the so formed threshold switching selector may be coupled to a storage cell to form a memory cell in a memory array. In more detail, a memory cell may include a threshold switching selector coupled to a word line, a storage cell coupled to the threshold switching selector, and a bit line coupled to the storage cell, where the threshold switching selector may include a threshold switching layer and a semiconductor layer. In embodiments, the storage cell may be a PCRAM storage cell, a MRAM storage cell, a RRAM storage cell, or another suitable type of storage cell.

In addition, from a device perspective, a RRAM storage cell may include a nucleation layer, also known as an oxygen exchange layer (OEL), for switching at low powers. Without the OEL, a RRAM storage cell may operate at high voltages and currents. An OEL may often be implemented using metals or other switching oxides, which may reduce the endurance of a RRAM device. In detail, a metal OEL may not regulate oxygen exchange as readily because of the existence of abundant oxygen within the metal. Similarly, a switching oxide based OEL may drift oxygen over time due to irreversible change in its own oxygen content.

In embodiments, a RRAM storage cell may include a semiconductor layer as an OEL. For example, a RRAM storage cell may include a resistive material layer and a semiconductor layer as an OEL between two electrodes. The semiconductor layer may have metal-oxygen bonds, making the OEL robust to oxygen drift. In addition, the semiconductor layer based OEL may have a higher activation energy for oxygen exchange compared to a metal OEL, hence guarding the RRAM storage cell against hastened endurance failure that other OELs induce. Accordingly, a RRAM storage cell including a semiconductor layer as an OEL may have reduced power consumption, and improved endurance properties compared to a RRAM storage cell with a metal or switching oxide as an OEL.

In embodiments, a RRAM device may include a RRAM storage cell, and a threshold switching selector, where the threshold switching selector may include a threshold switching layer and a semiconductor layer. The semiconductor layer of the threshold switching selector may be shared with the semiconductor layer of the RRAM storage cell. In other words, the semiconductor layer is included in the threshold switching selector, and may also be an OEL of a RRAM storage cell. In more detail, a RRAM device may include a first electrode and a second electrode. A threshold switching layer may be formed on the first electrode, and a semiconductor layer may be formed on the threshold switching layer, where the semiconductor layer and the threshold switching layer may form a threshold switching selector. Furthermore, a resistive switching material layer may be formed on the semiconductor layer, where the resistive switching material layer and the semiconductor layer may form a RRAM storage cell.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, side, on, above, below, beneath, lower, upper, over, under, and the like. Such descriptions are merely used to facilitate the discussion and are not intended to restrict the application of embodiments described herein to any particular orientation. It will be understood that those perspective-based descriptions are intended to encompass different orientations of the device in use or operation in addition to the orientation depicted in the figures. For example, if the device in a figure is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the perspective-based descriptions used herein should be interpreted accordingly. A first device may be adjacent to a second device if the first device is above or below the second device, without any third device in between them.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

Figure 1:
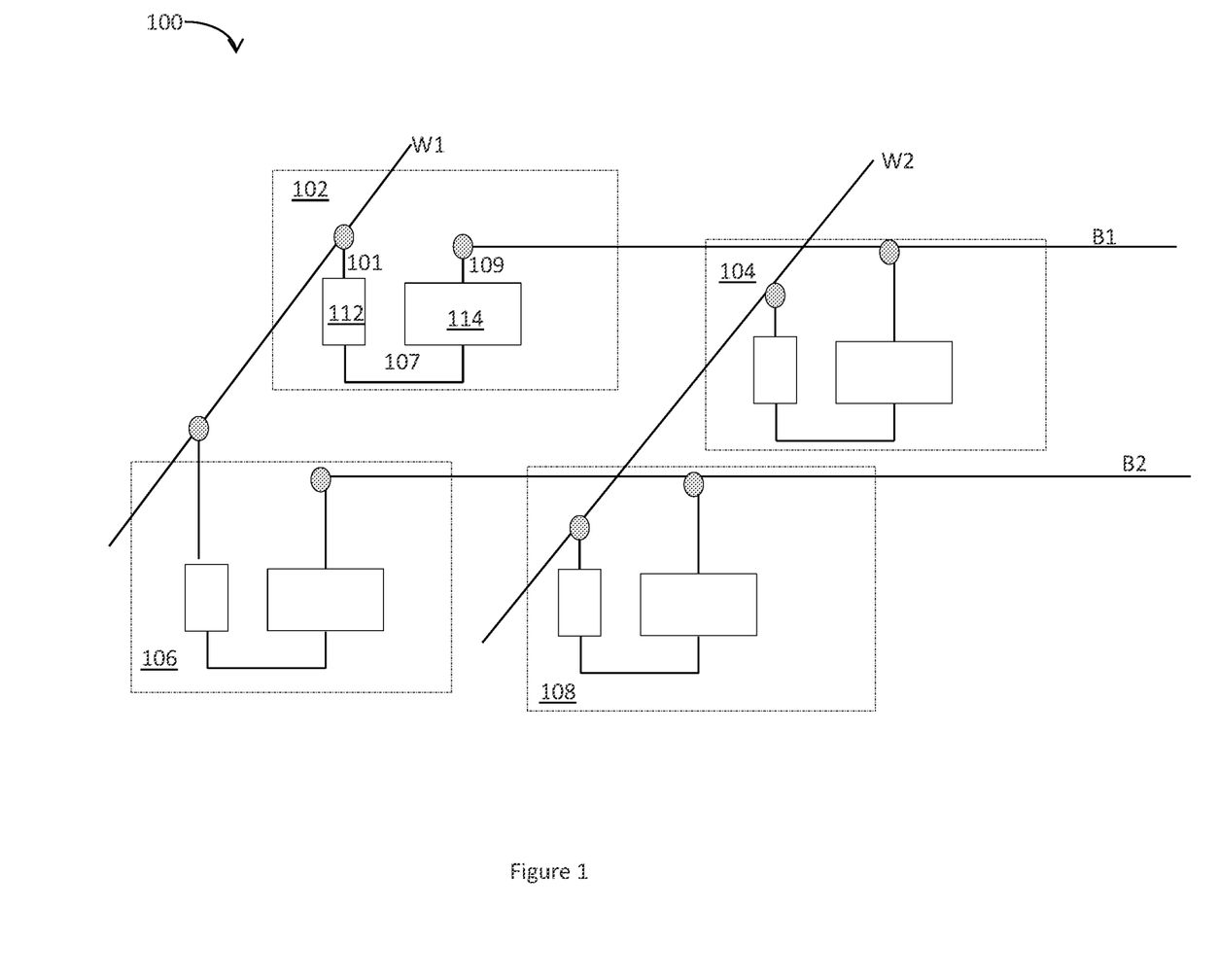
FIG. 1 schematically illustrates a diagram of a random access memory array including multiple memory cells, where a memory cell includes a selector and a storage cell, in accordance with various embodiments.

FIG. 1 schematically illustrates a memory array 100 with multiple memory cells (e.g., a memory cell 102, a memory cell 104, a memory cell 106, and a memory cell 108), in accordance with various embodiments. In embodiments, the multiple memory cells may be arranged in a number of rows and columns coupled by bit lines, e.g., bit line B1 and bit line B2, and word lines, e.g., word line W1 and word line W2.

A memory cell, e.g., the memory cell 102, may be coupled in series with other memory cells, e.g., the memory cell 106, of the same row, and may be coupled in parallel with the memory cells of other rows, e.g., the memory cell 104 and the memory cell 108. The memory array 100 may include any suitable number of one or more memory cells. Although the memory array 100 is shown in FIG. 1 with two rows that each includes two memory cells coupled in series, other embodiments may include other numbers of rows and/or numbers of memory cells within a row. In some embodiments, the number of rows may be different from the number of columns in a memory array. Each row of the memory array may have a same number of memory cells. Additionally, or alternatively, different rows may have different numbers of memory cells.

In embodiments, multiple memory cells, such as the memory cell 102, the memory cell 104, the memory cell 106, and the memory cell 108, may have a similar configuration. For example, the memory cell 102 may include a selector 112 and a storage cell 114. A memory cell may be controlled through the selector coupled to a bit line and a word line to read from the memory cell, write to the memory cell, and/or perform other memory operations. For example, the selector 112 may have an electrode 101 coupled to the word line W1, and the storage cell 114 may have an electrode 109 coupled to the bit line B1. In addition, the selector 112 and the storage cell 114 may be coupled together by the electrode 107.

In embodiments, the selector 112 may be a threshold switching selector. The selector 112 may switch between an "on" state and an "off" state depending on the amount of current or voltage applied across the selector 112. As a threshold switching selector, the selector 112 may change its state when a current or voltage through the selector 112 exceeds a respective threshold current or voltage. Once the threshold current or voltage is reached, the selector 112 may be in the on state which is a substantially conductive state. If the current or voltage drops below a threshold value, the selector 112 may return to the off state, which is a substantially non-conductive state.

In embodiments, the storage cell 114 may be a PCRAM storage cell, a MRAM storage cell, or a RRAM storage cell. In embodiments, the storage cell 114 may be switchable between two or more states with different resistance values upon an application of an electric current or voltage. For example, the storage cell 114 may be in a first state having a first resistance value to store a logic 0 bit, and may be in a second state having a second resistance value to store a logic 1 bit. In embodiments, the resistance difference between the two resistance values may be one or more orders of magnitude.

In more detail, when the storage cell 114 is a PCRAM storage cell, the storage cell 114 may be in a first state to store a logic 0 when the phase-change material of the PCRAM storage cell is in a crystalline phase having a low resistance value, and may be in a second state to store a logic 1 when the phase-change material of the PCRAM storage cell is in an amorphous phase having a high resistance value. When the storage cell 114 may be a MRAM storage cell, the storage cell 114 may be in a first state to store a logic 0 when the reference layer and the free layer of the MTJ of the MRAM storage cell have a same magnetic direction resulting in a low resistance value of the MTJ, and the storage cell 114 may be in a second state to store a logic 1 when the reference layer and the free layer of the MTJ of the MRAM storage cell have a different magnetic direction resulting in a high resistance value of the MTJ. An example of the storage cell 114 being a RRAM storage cell may be illustrated in more details in FIG. 4.

In embodiments, the storage cell 114 may be individually controllable by the selector 112 to switch between the first state and the second state. When the word line W1 is active, the selector 112 may select the storage cell 114. A signal from the word line W1 may pass through the selector 112, further through the storage cell 114, and reaching the other electrode, which is the bit line B1.

In various embodiments, the memory cells, e.g., the memory cell 102, the memory cell 104, the memory cell 106, and the memory cell 108, included in the memory array 100 may be formed in back-end-of-line (BEOL) processing. Accordingly, the memory array 100 may be formed in higher metal layers, e.g., metal layer three and/or metal layer four, of the integrated circuit above the active substrate region, and may not occupy the active substrate area that is occupied by conventional transistors or memory devices.

Figure 2:
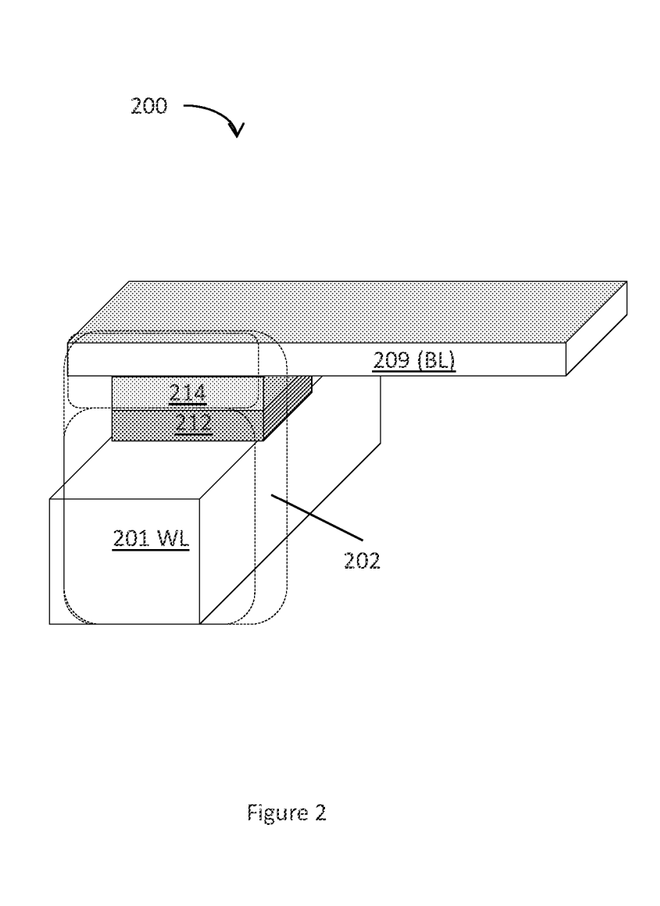
FIG. 2 schematically illustrates a three-dimensional view of another memory array including a memory cell having a selector and a storage cell, in accordance with various embodiments.

FIG. 2 schematically illustrates a three-dimensional view of another memory array 200 including a memory cell 202, in accordance with various embodiments. In embodiments, the memory cell 202 may be similar to the memory cell 102 in FIG. 1. There may be more memory cells in the array 200, not shown in FIG. 2 for simplicity reasons.

In embodiments, similar to the memory cell 102 in FIG. 1, the memory cell 202 may include a selector 212 coupled to a storage cell 214. In addition, the selector 212 may be coupled to an electrode 201, e.g., a word line, and the storage cell 214 may be coupled to an electrode 209, e.g., a bit line. In some embodiments, as shown in FIG. 2, the storage cell 214 and the selector 212 may be coupled without an electrode in between. Even though there is only one layer shown in FIG. 2 for the selector 212 and the storage cell 214, there may be more layers included in the selector 212 and the storage cell 214. More details about the layers in the selector 212 and the storage cell 214 may be illustrated in FIG. 3 and FIG. 4.

Figure 3:
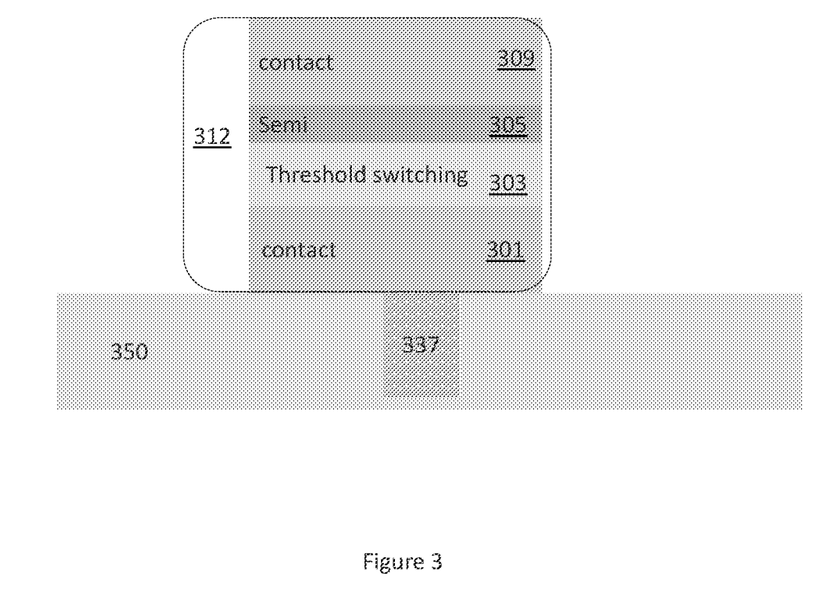
FIG. 3 schematically illustrates a cross sectional view of a threshold switching selector, in accordance with various embodiments.

FIG. 3 schematically illustrates a cross sectional view of a threshold switching selector 312, in accordance with various embodiments. In embodiments, the threshold switching selector 312 may be similar to the selector 112 in FIG. 1, or the selector 212 in FIG. 2.

In embodiments, the threshold switching selector 312 may include an electrode 301 (also referred to as contact 301), a threshold switching layer 303 on the electrode 301, a semiconductor layer 305 on the threshold switching layer 303, and another electrode 309 on the 5 semiconductor layer 305. The threshold switching selector 312 may be a back end device formed on a substrate 350. The threshold switching selector 312 may be in contact with an electrode 337 within the substrate 350. The electrode 301 may be part of and/or be coupled to a word line, and the electrode 309 may be part of and/or be coupled to a bit line.

In embodiments, the substrate 350 may be a silicon substrate, a silicon on insulator (SOI) substrate, or a silicon on sapphire (SOS) substrate, among various other substrate materials. The electrode 301 and/or the electrode 309 may include gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf. The thickness of the electrode 301 and/or the electrode 309 may be between a range about 100-500 nm.

In embodiments, the threshold switching layer 303 may include $Hfo_x$, $TaO_x$, $Ge_xTe_y$, Si, $Si_xGe_yTe_z$, $Si_xTe_yAs_zGe_w$, $NbO_x$, $VO_x$, AsTeGeSi, $As_2Te_3Ge$, $As_2Se_3Ge$, $NiO_x$, a metal doped oxide, or more. The semiconductor layer 307 may include ZnO, InOx, GaOx, IGZO, IZO, ITO, SnOx, Cu2O, CuO, CoO, amorphous Si, amorphous Ge, polysilicon, some other semiconducting oxide material, a transition metal chalcogenide, a transition metal oxide, or more. The thickness of the semiconductor layer 305 and/or the threshold switching layer 303 may be between a range about 1-20 nm.

Figure 4:
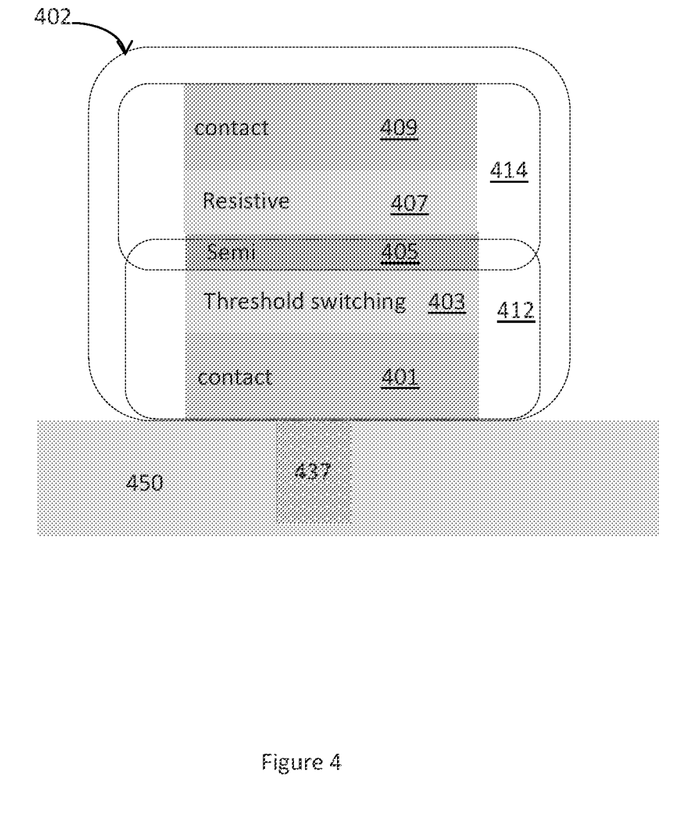
FIG. 4 schematically illustrates a cross sectional view of a resistive random access memory (RRAM) device including a RRAM storage cell and a threshold switching selector, in accordance with various embodiments.

FIG. 4 schematically illustrates a cross sectional view of a RRAM device 402 including a RRAM storage cell 414 and a threshold switching selector 412, in accordance with various embodiments. In embodiments, the memory cell 402 may be similar to the memory cell 102 in FIG. 1, or the memory cell 202 in FIG. 2. The threshold switching selector 412 may be similar to the threshold switching selector 312 in FIG. 3.

In embodiments, the RRAM memory cell 402 may include an electrode 401 and another electrode 409, a threshold switching layer 403 on the electrode 401, and a semiconductor layer 405 on the threshold switching layer 403. The semiconductor layer 405 and the threshold switching layer 403 contained between the electrode 401 and the electrode 409 may form the threshold switching selector 412.

In addition, the RRAM memory cell 402 may include a resistive material layer 407 on the semiconductor layer 405, while another electrode 409 may be on the resistive material layer 407. The resistive material layer 407 and the semiconductor layer 405 contained between the electrode 401 and the electrode 409 may form the RRAM storage cell 414. The semiconductor layer 405 may be an OEL of the RRAM storage cell 414. Therefore, the semiconductor layer 405 may be shared between the threshold switching selector 412 and the RRAM storage cell 414, resulting in a compact design of a selector coupled to a storage cell for a RRAM memory cell.

The RRAM memory cell 402 may be a back end device formed on a substrate 450, and in contact with an electrode 437 within the substrate 450. In embodiments, the substrate 450 may be a silicon substrate, a SOI substrate, or a silicon on sapphire (SOS) substrate, among various other substrate materials.

In embodiments, the resistive material layer 407 may include HfOx, TaOx, HfTaOx, Te, Ge, Si, chalcogenide, a transition metal oxide, or a transition metal chalcogenide. Additionally or alternatively, in some embodiments, the resistive material layer 407 may include one or more oxide of W, Ta, Ti, Ni, Co, Hf, Ru, Zr, Zn, Fe, Sn, Al, Cu, Ag, Mo, or Cr. In some embodiments, silicon may be included in the resistive material layer 407 to form a composite material. The thickness of the resistive material layer 407 may be between a range about 1-20 nm.

In embodiments, the material in the resistive material layer 407 may be formed in an initial state with a first resistance value, e.g., a relatively low-resistance state such as 105 ohms. When a first voltage, e.g., a set operating voltage, such as 3 V, is applied to the threshold switching selector 412 and is greater than the threshold voltage of the threshold switching selector 412, the threshold switching selector 412 may turn to the on state, and the storage cell 414 connected to the threshold switching selector 412 may be selected. Hence, the resistive material layer 407 may switch to a stable second resistance value, e.g., a high-resistance state, such as $10^7$ ohms, which is maintained even after the voltage is removed. This resistance switching may be reversible such that subsequent application of an appropriate current or a second voltage can serve to return the resistive material layer 407 to a stable first resistance value which is maintained even after the voltage or current is removed. In some embodiments, the first resistance value may be a high-resistance value rather than a low-resistance value. A set process may refer to switching the resistive material layer 407 from a first resistance value to a second resistance value, while a reset process may refer to switching the resistive material layer 407 from the second resistance value to the first resistance value. In some embodiments, the set process may be referred to as a "forming" process, while the reset process may be referred to as a "re-forming" process.

When a first voltage, e.g., set operating voltage, is applied to the RRAM memory cell 402 including the threshold switching selector 412, from the electrode 401 to the electrode 409, oxygen ions may move from the resistive material layer 407 to the semiconductor layer 405, which is the OEL of the RRAM storage cell 414. As oxygen ions are moved to the semiconductor layer 405, an oxygen ion concentration may be increased at the semiconductor layer 45. As the oxygen ion concentration increases, the semiconductor layer 405 may increase the resistance value. Accordingly, the resistance value of the storage cell 414 may also become higher. Therefore, the resistance of the storage cell goes through a set process to switch from a first resistance value to a second resistance value. Hence, it may be considered that a first bit data, e.g., "1" or "0", is written to the RRAM storage cell, i.e., the RRAM storage cell 414.

Meanwhile, if a second voltage different from the first voltage is applied to the threshold switching selector 412 and is greater than the threshold voltage of the threshold switching selector 412, the threshold switching selector 412 may turn to the on state, and the storage cell 414 connected to the threshold switching selector 412 may be selected. Once the storage cell 414 is selected by the second voltage different from the first voltage, oxygen ions may move from the semiconductor layer 405 to the resistive material layer 407 in the storage cell 414. Therefore, oxygen ion concentration at the semiconductor layer 405 decreases to the concentration prior to the application of the first voltage. As a result, the oxygen ions in the semiconductor layer 405 may be lowered. Due to the application of the second voltage, resistance of the storage cell 414 may become lower, which may be the first resistance value. When the resistance of the storage cell 414 is the first resistance value, it may be considered that a second bit data, e.g., "0" or "1", is written to the RRAM storage cell, i.e., the RRAM storage cell 414.

Figure 5:
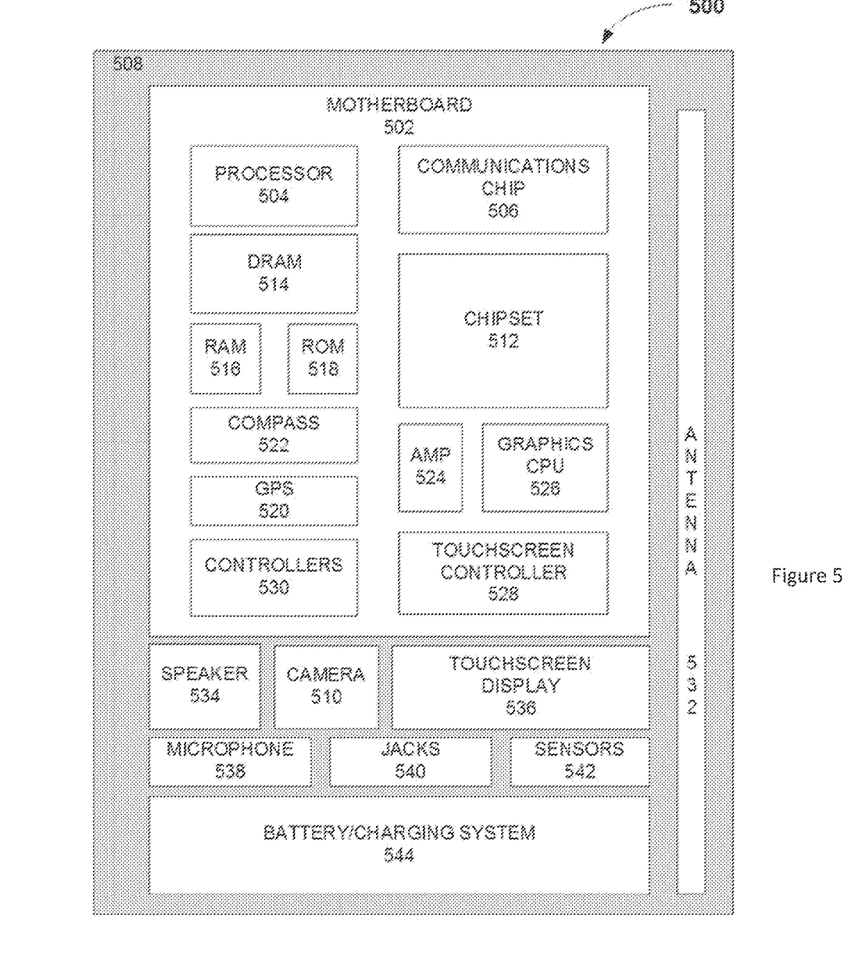
FIG. 5 illustrates an example system configured to employ the apparatuses and methods described herein, in accordance with various embodiments.

FIG. 5 illustrates an example system configured to employ the apparatuses and methods described herein, in accordance with various embodiments. FIG. 5 illustrates an example computing device 500 that may employ the apparatuses and/or methods described herein (e.g., the memory array 100, the memory array 200, the threshold switching selector 312, and the RRAM memory cell 402), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, memory controller, volatile memory (e.g., dynamic random access memory (DRAM) 514), non-volatile memory such as read only memory (ROM) 518, random access memory (RAM) 516, flash memory, storage device (e.g., a hard-disk drive (HDD)), an I/O controller 530, a digital signal processor (not shown), a crypto processor (not shown), a graphics processor 526, one or more antenna 532, a display (not shown), a touch screen display 520, a touch screen controller 528, a battery 544, an audio codec (not shown), a video codec (not shown), a global positioning system (GPS) device 520, a compass, sensors 542, a microphone 538, jacks 540, an accelerometer (not shown), a gyroscope (not shown), a speaker 534, a camera 510, and a mass storage device (such as hard disk drive, a solid state drive, compact disk (CD), digital versatile disk (DVD)) (not shown), and so forth. In various embodiments, the processor 504 may be integrated on the same die with other components to form a System on Chip (SoC).

In some embodiments, the one or more processor(s) 504, various memories such as DRAM 514, RAM 516, ROM 518, and other flash memory, and/or storage device may include associated firmware (not shown) storing programming instructions configured to enable computing device 500, in response to execution of the programming instructions by one or more processor(s) 504, to practice all or selected aspects of the methods described herein. In various embodiments, these aspects may additionally or alternatively be implemented using hardware separate from the one or more processor(s) 504, DRAM 514, RAM 516, ROM 518, and other flash memory, or storage device.

In various embodiments, one or more components of the computing device 500 may include one or more memory array that employ one or more memory cells as described herein. For example, the memory array with one or more memory cells may be included in processor 504, controller 530, and/or another component of computing device 500. Additionally, or alternatively, one or more components of the computing device 500, such as DRAM 514, RAM 516, ROM 518, and other flash memory, or storage device, may include the memory array 100, the memory array 200, the threshold switching selector 312, and/or the RRAM memory cell 402 described herein.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

Figure 6:
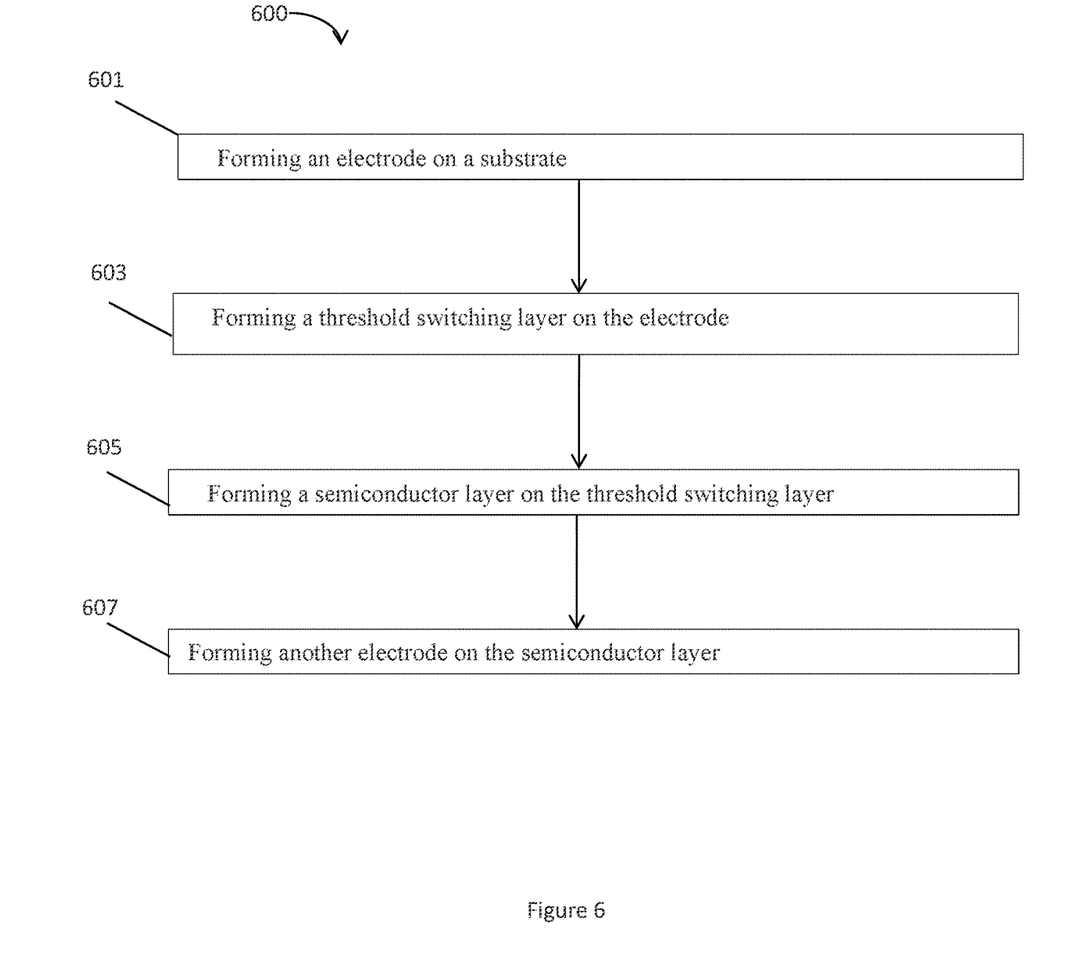
FIG. 6 illustrates an example process for manufacturing a threshold switching selector, in accordance with various embodiments.

FIG. 6 illustrates an example process 600 for manufacturing a threshold switching selector, in accordance with various embodiments. In embodiments, the threshold switching selector formed by the process 600 may be similar to the selector 112 in FIG. 1, the selector 212 in FIG. 2, or the threshold switching selector 312 shown in FIG. 3.

Operation 601 may be performed to form an electrode on a substrate, such as to form the electrode 301 on the substrate 350. Operation 603 may be performed to form a threshold switching layer on the electrode, such as to form the threshold switching layer 303 on the electrode 301. Operation 605 may be performed to form a semiconductor layer on the threshold switching layer, such as to form the semiconductor layer 305 on the threshold switching layer 303. Operation 607 may be performed to form another electrode on the semiconductor layer, such as to form the electrode 309 on the semiconductor layer 305. A threshold switching selector, e.g., the threshold switching selector 312 may be formed by the operation 601, the operation 603, the operation 605, and the operation 607.

Some Non-Limiting Examples are Presented Below.

Example 1 may include a semiconductor device, comprising: a first electrode; a threshold switching layer on the first electrode; a semiconductor layer on the threshold switching layer; and a second electrode on the semiconductor layer.

Example 2 may include the semiconductor device of example 1 and/or other suitable examples herein, wherein the semiconductor layer includes ZnO, InOx, GaOx, IGZO, IZO, ITO, SnOx, Cu2O, CuO, CoO, amorphous Si, amorphous Ge, polysilicon, a transition metal chalcogenide, or a transition metal oxide.

Example 3 may include the semiconductor device of example 1 and/or other suitable examples herein, wherein the threshold switching layer includes $HfO_x$, $TaO_x$, $Ge_xTe_y$, Si, $Si_xGe_yTe_z$, $Si_xTe_yAs_zGe_w$, $NbO_x$, $VO_x$, AsTeGeSi, $As_2Te_3Ge$, $As_2Se_3Ge$, $NiO_x$, or a metal doped oxide.

Example 4 may include the semiconductor device of example 1 and/or other suitable examples herein, wherein the first electrode or the second electrode includes gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf.

Example 5 may include the semiconductor device of any of examples 1-4 and/or other suitable examples herein, wherein the threshold switching layer, or the semiconductor layer has a thickness in a range of about 1-20 nm.

Example 6 may include a resistive random access memory (RRAM) device, comprising: a semiconductor substrate; a first electrode on the semiconductor substrate; a threshold switching layer on the first electrode, wherein the threshold switching layer is included in a selector; a semiconductor layer on the threshold switching layer, wherein the semiconductor layer is included in the selector, and is also an oxygen exchange layer of a RRAM storage cell; a resistive switching material layer on the semiconductor layer, wherein the resistive switching material layer is included in the RRAM storage cell; and a second electrode on the resistive switching material layer.

Example 7 may include the RRAM device of example 6 and/or other suitable examples herein, wherein the semiconductor layer includes ZnO, InOx, GaOx, IGZO, IZO, ITO, SnOx, Cu2O, CuO, CoO, amorphous Si, amorphous Ge, polysilicon, a transition metal chalcogenide, or a transition metal oxide.

Example 8 may include the RRAM device of example 6 and/or other suitable examples herein, wherein the resistive switching material layer includes HfOx, TaOx, HfTaOx, Te, Ge, Si, or chalcogenide.

Example 9 may include the RRAM device of example 6 and/or other suitable examples herein, wherein the resistive switching material layer includes a transition metal oxide or a transition metal chalcogenide.

Example 10 may include the RRAM device of example 6 and/or other suitable examples herein, wherein the first electrode or the second electrode includes gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf.

Example 11 may include the RRAM device of any of examples 6-10 and/or other suitable examples herein, wherein the threshold switching layer includes $HfO_x$, $TaO_x$, $Ge_xTe_y$, Si, $Si_xGe_yTe_z$, $Si_xTe_yAs_zGe_w$, $NbO_x$, $VO_x$, AsTeGeSi, $As_2Te_3Ge$, $As_2Se_3Ge$, $NiO_x$, or a metal doped oxide.

Example 12 may include the RRAM device of any of examples 6-10 and/or other suitable examples herein, wherein the resistive switching material layer, the threshold switching layer, or the semiconductor layer has a thickness in a range of about 1-20 nm.

Example 13 may include a resistive random access memory (RRAM) array, comprising: a word line; a plurality of RRAM memory cells, wherein a RRAM memory cell of the plurality of RRAM memory cells includes a selector coupled to a RRAM storage cell, and further includes: a threshold switching layer coupled to the word line, wherein the threshold switching layer is included in the selector; a semiconductor layer on the threshold switching layer, wherein the semiconductor layer is included in the selector, and is also an oxygen exchange layer of the RRAM storage cell; a resistive switching material layer on the semiconductor layer, wherein the resistive switching material layer is included in the RRAM storage cell; and a bit line on the resistive switching material layer.

Example 14 may include the RRAM array of example 13 and/or other suitable examples herein, wherein the semiconductor layer includes ZnO, InOx, GaOx, IGZO, IZO, ITO, SnOx, Cu2O, CuO, CoO, amorphous Si, amorphous Ge, polysilicon, a transition metal chalcogenide, or a transition metal oxide.

Example 15 may include the RRAM array of example 13 and/or other suitable examples herein, wherein the resistive switching material layer includes HfOx, TaOx, HfTaOx, Te, Ge, Si, or chalcogenide.

Example 16 may include the RRAM array of example 13 and/or other suitable examples herein, wherein the resistive switching material layer includes a transition metal oxide or a transition metal chalcogenide.

Example 17 may include the RRAM array of example 13 and/or other suitable examples herein, wherein the word line or the bit line includes gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf.

Example 18 may include the RRAM array of any of examples 13-17 and/or other suitable examples herein, wherein the threshold switching layer includes $HfO_x$, $TaO_x$, $Ge_xTe_y$, Si, $Si_xGe_yTe_z$, $Si_xTe_yAs_zGe_w$, $NbO_x$, $VO_x$, AsTeGeSi, $As_2Te_3Ge$, $As_2Se_3Ge$, or $NiO_x$, or a metal doped oxide.

Example 19 may include a computing device, comprising: a circuit board; and a memory device coupled to the circuit board and including a plurality of memory cells, wherein a memory cell of the plurality of memory cells includes: a word line of the memory device; a selector coupled to the word line, wherein the selector includes a threshold switching layer coupled to the word line, and a semiconductor layer on the threshold switching layer; a storage cell coupled to the selector; and a bit line of the memory device, the bit line coupled to the storage cell.

Example 20 may include the computing device of example 19 and/or other suitable examples herein, wherein the semiconductor layer includes ZnO, InOx, GaOx, IGZO, IZO, ITO, SnOx, Cu2O, CuO, CoO, amorphous Si, amorphous Ge, polysilicon, a transition metal chalcogenide, or a transition metal oxide.

Example 21 may include the computing device of example 19 and/or other suitable examples herein, wherein the threshold switching layer includes $HfO_x$, $TaO_x$, $Ge_xTe_y$, Si, $Si_xGe_yTe_z$, $Si_xTe_yAs_zGe_w$, $NbO_x$, $VO_x$, AsTeGeSi, $As_2Te_3Ge$, $As_2Se_3Ge$, $NiO_x$, or a metal doped oxide.

Example 22 may include the computing device of example 19 and/or other suitable examples herein, wherein the storage cell is a phase-change random access memory (PCRAM) storage cell, a magnetic random access memory (MRAM) storage cell, or a resistive random access memory (RRAM) storage cell.

Example 23 may include the computing device of any of examples 19-22 and/or other suitable examples herein, wherein the storage cell is a resistive random access memory (RRAM) storage cell including: the semiconductor layer of the selector, wherein the semiconductor layer is an oxygen exchange layer of the RRAM storage cell; and a resistive switching material layer on the semiconductor layer.

Example 24 may include the computing device of example 23 and/or other suitable examples herein, wherein the resistive switching material layer includes HfOx, TaOx, HfTaOx, Te, Ge, Si, or chalcogenide.

Example 25 may include the computing device of any of examples 19-22 and/or other suitable examples herein, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Although certain embodiments have been illustrated and described herein for purpose of description, this application is intended to cover any adaptations or variations of the embodiments discussed herein. Therefore, it is manifestly intended that embodiments described herein be limited only by the claims.

What is claimed is:

1. A semiconductor device, comprising:
   a first electrode;
   a threshold switching layer on the first electrode, wherein the threshold switching layer includes Tantalum (Ta);
   a semiconductor layer on the threshold switching layer; and
   a second electrode on the semiconductor layer.

2. The semiconductor device of claim 1, wherein the semiconductor layer includes a selected one or more of: ZnO, InOx, GaOx, IGZO, IZO, ITO, SnOx, Cu2O, CuO, CoO, amorphous Si, amorphous Ge, polysilicon, a transition metal chalcogenide, or a transition metal oxide.

3. The semiconductor device of claim 1, wherein the first electrode or the second electrode includes a selected one or more of: gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), TaN, TiN, TiAlN, TiW, or Hf.

4. The semiconductor device of claim 1, wherein the threshold switching layer, or the semiconductor layer has a thickness in a range of about 1-20 nm.

5. A resistive random access memory (RRAM) device, comprising:
   a semiconductor substrate;
   a first electrode on the semiconductor substrate;
   a threshold switching layer on the first electrode, wherein the threshold switching layer includes Tantalum (Ta), and wherein the threshold switching layer is included in a selector;
   a semiconductor layer on the threshold switching layer, wherein the semiconductor layer is included in the selector, and is also an oxygen exchange layer of a RRAM storage cell;
   a resistive switching material layer on the semiconductor layer, wherein the resistive switching material layer is included in the RRAM storage cell; and
   a second electrode on the resistive switching material layer.

6. The RRAM device of claim 5, wherein the semiconductor layer includes a selected one or more of: ZnO, InOx, GaOx, IGZO, IZO, ITO, SnOx, Cu2O, CuO, CoO, amorphous Si, amorphous Ge, polysilicon, a transition metal chalcogenide, or a transition metal oxide.

7. The RRAM device of claim 5, wherein the resistive switching material layer includes a selected one or more of: HfOx, TaOx, HfTaOx, Te, Ge, Si, or chalcogenide.

8. The RRAM device of claim 5, wherein the resistive switching material layer includes a selected one or more of: a transition metal oxide or a transition metal chalcogenide.

9. The RRAM device of claim 5, wherein the first electrode or the second electrode includes a selected one or more of: gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), TaN, TiN, TiAlN, TiW, or Hf.

10. The RRAM device of claim 5, wherein the resistive switching material layer, the threshold switching layer, or the semiconductor layer has a thickness in a range of about 1-20 nm.

11. A resistive random access memory (RRAM) array, comprising:
    a word line; and
    a plurality of RRAM memory cells, wherein a RRAM memory cell of the plurality of RRAM memory cells includes a selector coupled to a RRAM storage cell, and further includes:
    a threshold switching layer coupled to the word line, wherein the threshold switching layer includes Tantalum (Ta), and wherein the threshold switching layer is included in the selector;
    a semiconductor layer on the threshold switching layer, wherein the semiconductor layer is included in the selector, and is also an oxygen exchange layer of the RRAM storage cell;
    a resistive switching material layer on the semiconductor layer, wherein the resistive switching material layer is included in the RRAM storage cell; and
    a bit line on the resistive switching material layer.

12. The RRAM array of claim 11, wherein the semiconductor layer includes a selected one or more of: ZnO, InOx, GaOx, IGZO, IZO, ITO, SnOx, Cu2O, CuO, CoO, amorphous Si, amorphous Ge, polysilicon, a transition metal chalcogenide, or a transition metal oxide.

13. The RRAM array of claim 11, wherein the resistive switching material layer includes HfOx, TaOx, HfTaOx, Te, Ge, Si, or chalcogenide.

14. The RRAM array of claim 11, wherein the resistive switching material layer includes a transition metal oxide or a transition metal chalcogenide.

15. The RRAM array of claim 11, wherein the word line or the bit line includes a selected one or more of: gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), TaN, TiN, TiAlN, TiW, or Hf.

16. A computing device, comprising:
    a circuit board; and
    a memory device coupled to the circuit board and including a plurality of memory cells, wherein a memory cell of the plurality of memory cells includes:
    a word line of the memory device;
    a selector coupled to the word line, wherein the selector includes a threshold switching layer that includes Tantalum (Ta), coupled to the word line, and a semiconductor layer on the threshold switching layer;
    a storage cell coupled to the selector; and
    a bit line of the memory device, the bit line coupled to the storage cell.

17. The computing device of claim 16, wherein the semiconductor layer includes a selected one or more of: ZnO, InOx, GaOx, IGZO, IZO, ITO, SnOx, Cu2O, CuO, CoO, amorphous Si, amorphous Ge, polysilicon, a transition metal chalcogenide, or a transition metal oxide.

18. The computing device of claim 16, wherein the storage cell is a phase-change random access memory (PCRAM) storage cell, a magnetic random access memory (MRAM) storage cell, or a resistive random access memory (RRAM) storage cell.

19. The computing device of claim 16, wherein the storage cell is a resistive random access memory (RRAM) storage cell including:
- the semiconductor layer of the selector, wherein the semiconductor layer is an oxygen exchange layer of the RRAM storage cell; and
- a resistive switching material layer on the semiconductor layer.

20. The computing device of claim 19, wherein the resistive switching material layer includes a selected one or more of: HfOx, TaOx, HfTaOx, Te, Ge, Si, or chalcogenide.

21. The computing device of claim 16, wherein the computing device is a wearable device or a mobile computing device, the wearable device or the mobile computing device including a selected one or more of: an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *

UNITED STATES PATENT AND TRADEMARK OFFICE
CERTIFICATE OF CORRECTION

| | |
|---|---|
| PATENT NO. | : 11,348,973 B2 |
| APPLICATION NO. | : 16/326896 |
| DATED | : May 31, 2022 |
| INVENTOR(S) | : Abhishek A. Sharma et al. |

It is certified that error appears in the above-identified patent and that said Letters Patent is hereby corrected as shown below:

In the Specification

Column 14
Line 20, "…, wherein a RRAIVI…" should read - "…, wherein a RRAM…" -
Line 22, "…a RRAIVI storage cell," should read - "…a RRAM storage cell," -
Line 36, "The RRAIVI array…" should read - "The RRAM array…" -
Line 47, "The RRAIVI array…" should read - "The RRAM array…" -

Signed and Sealed this
Ninth Day of August, 2022

Katherine Kelly Vidal
*Director of the United States Patent and Trademark Office*